(12) United States Patent
Rey et al.

(10) Patent No.: US 8,885,788 B1
(45) Date of Patent: Nov. 11, 2014

(54) REDUCING SETTLING TIME IN PHASE-LOCKED LOOPS

(71) Applicant: Intel IP Corporation, Santa Clara, CA (US)

(72) Inventors: Claudio Rey, Tempe, AZ (US); David Harnishfeger, Chandler, AZ (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 13/895,139

(22) Filed: May 15, 2013

(51) Int. Cl.
*H03D 3/24* (2006.01)
*H03L 7/099* (2006.01)

(52) U.S. Cl.
CPC .................................. *H03L 7/0993* (2013.01)
USPC ........................................................ 375/376

(58) Field of Classification Search
USPC ................. 375/226, 371, 375, 376; 370/516; 327/146–147, 155–156
See application file for complete search history.

(56) References Cited

U.S. PATENT DOCUMENTS

| 2006/0109059 A1* | 5/2006 | Skerritt ........................... 331/16 |
| 2006/0258313 A1* | 11/2006 | Uozumi et al. ............ 455/252.1 |
| 2007/0052488 A1* | 3/2007 | Kasahara et al. ............... 331/16 |
| 2007/0255547 A1* | 11/2007 | Estep et al. ...................... 703/15 |
| 2008/0079509 A1* | 4/2008 | Serrano et al. ................ 331/175 |
| 2008/0231375 A1* | 9/2008 | Welz et al. ....................... 331/17 |
| 2008/0248771 A1* | 10/2008 | Dunworth et al. ............ 455/258 |

FOREIGN PATENT DOCUMENTS

EP 1 030 453 A1 8/2000

OTHER PUBLICATIONS

Liangge Xu et al., "An ADPLL-based fast start-up technique for sensor radio frequency synthesizers", Electronics, Circuits and Systems, 2008. ICECS Sep. 2008.
Meng-Ting Tsai et al., "A Fast-Locking Agile Frequency Synthesizer for MIMO Dual-mode WiFi / WiMAX Applications", Electronics, Circuits and Systems, Dec. 2007. ICECS 2007.

* cited by examiner

*Primary Examiner* — Khanh C Tran
(74) *Attorney, Agent, or Firm* — Baker Botts L.L.P.

(57) ABSTRACT

A circuit may include a phase detector configured to generate a phase error signal based on a feedback signal and an oscillator configured to generate an output signal. The feedback signal may be based on the output signal. The circuit may also include a determination unit configured to measure a phase of the feedback signal based on the phase error signal when an output of the phase detector and an input of the oscillator are communicatively decoupled. The circuit may also include an adjustment unit configured to subtract the measured phase of the feedback signal from an intermediate signal upon which the output signal is based when the output of the phase detector and the input of the oscillator are communicatively coupled.

20 Claims, 6 Drawing Sheets

REDUCING SETTLING TIME IN PHASE-LOCKED LOOPS

FIELD

The embodiments discussed herein are related to reducing settling times in phase-locked loops.

BACKGROUND

Phase-locked loops (PLLs) have been applied to many applications ranging from generating clock signals in microprocessors to synthesizing frequencies. In general, a PLL may include a voltage-controlled oscillator (VCO) that generates an output signal with a frequency that is locked onto a frequency of a reference signal. To lock the frequency of the output signal with the frequency of the input signal, a MI may include a phase detector (PD) configured to compare the phase of the reference signal to the phase of an output signal generated by the oscillator, and to generate a PD output that is proportional to the phase difference between the phase of the input signal and the phase of the output signal.

Through the feedback of the output signal to the PD, the PLL drives the frequency of the output signal to the frequency of the input signal and locks the phase of the output signal with the phase of the input signal. The PLL may also assist in correcting any phase misalignment resulting from internal or external noise sources.

The use of PLLs on interfaces is becoming snore common as speeds increase and precise timing is required. Upon power up, reset, or a frequency change, PLLs may have a "settling time" to lock the phase and/or frequency of the output signal to the phase and/or frequency of the input signal and stabilize the PLL. Depending on the phase and/or frequency mismatch between the output phase and the input signal the settling time may vary.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit may include a phase detector configured to generate a phase error signal based on a feedback signal and an oscillator configured to generate an output signal. The feedback signal may be based on the output signal. The circuit may also include a determination unit configured to measure a phase of the feedback signal based on the phase error signal when an output of the phase detector and an input of the oscillator are communicatively decoupled. The circuit may also include an adjustment unit configured to subtract the measured phase of the feedback signal from an intermediate signal upon which the output signal is based when the output of the phase detector and the input of the oscillator are communicatively coupled.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

According to an aspect of an embodiment, a method of reducing settling time in a phase-locked loop (PLL) that includes a phase detector and an oscillator is described. In particular, a method is described that may reduce or eliminate settling time in the PLL when the PLL begins generating an output signal by subtracting a phase difference between a feedback signal and a reference signal from control signals within the PLL.

When a PLL switches from generating a first output signal to generating a second output signal, the PLL may lock to the frequency of the second output signal by being provided a previously determined oscillator control signal that caused the PLL to generate the second output signal. The phase of the output signal may require time to settle due to components within the PLL affecting the phase of the output signal in an unpredictable manner. To achieve a locked condition with reduced or eliminated settling time, the PLL may compensate for the phase unpredictability.

The method of achieving a locked condition with reduced or eliminated settling time may include communicatively decoupling an output of the phase detector from an input to the oscillator and providing an input signal based on a previously determined oscillation control signal for an output signal to the oscillator to generate the output signal. A phase error signal based on a feedback signal and a reference signal may be generated using the phase detector. In some embodiments, the feedback signal may be generated by dividing the output signal in a feedback loop of the PLL.

A phase of the feedback signal may be measured based on the phase error signal. The measured phase may represent the phase unpredictability in the PLL. The measured phase may be subtracted from the phase error signal when the output of the phase detector is communicatively coupled with the input to the oscillator. By subtracting the measured phase from the phase error signal, the PLL may reduce or eliminate the settling time and may be locked to the desired frequency and phase without the PLL having to work out for the phase unpredictability over time. In contrast, in previous PLLs, the phase unpredictability would be compensated for by the PLL over a settling period.

Embodiments of the present invention will be explained with reference to the accompanying drawings.

Figure 1:
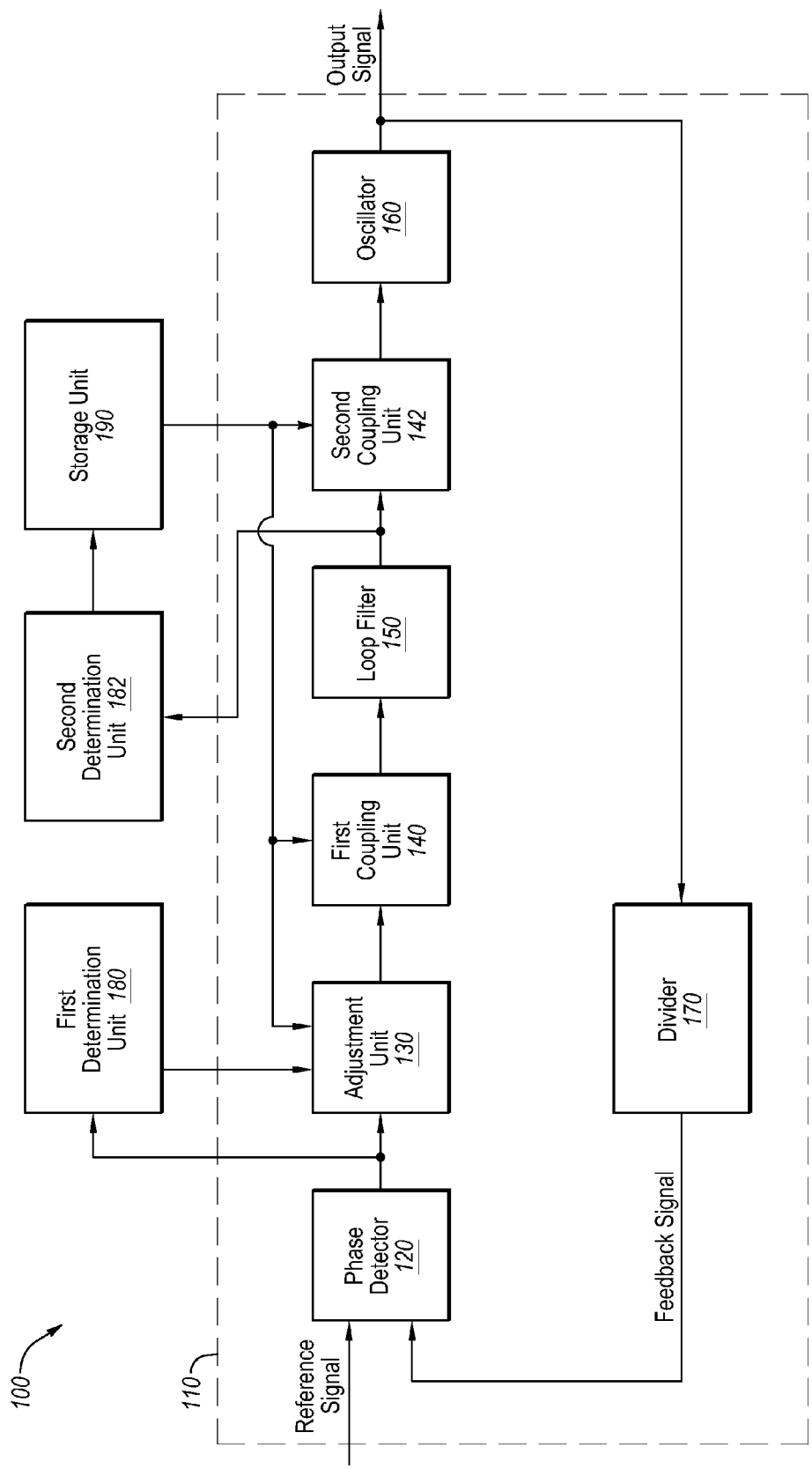
FIG. 1 is a block diagram of an example system for reducing settling time in a phase-locked loop.

FIG. 1 is a block diagram of an example system 100 for reducing settling time in a PLL 110, arranged in accordance with at least some embodiments described herein. The system 100 may be configured to generate an output signal with reduced or no settling time by the PLL 110. In particular, the system 100 may be configured to allow switching between output signals and having reduced or no settling time by the PLL 110 after switching to an output signal. For example, the system 100 may be generating a first output signal at a first frequency. The system 100 may switch to generating a second output signal at a second frequency. After the system 100 begins outputting the second output signal, the system 100 may have a minimal (e.g. less than 1 microsecond) or no settling time during which the PLL 110 is locking to the frequency and phase of the second output signal.

To generate an output signal at a desired frequency with reduced or no settling time, the system 100 may include the PLL 110, a first determination unit 180, a second determination unit 182, and a storage unit 190. The PLL 110 may include a phase detector 120, an adjustment unit 130, a first coupling unit 140, a second coupling unit 142, a loop filter 150, an oscillator 160, and a divider 170. The basic components and their basic functionality within the system 100 are now explained. An example of how the components may operate together to reduce the settling time of the PLL 110 is explained hereafter.

The PLL 110 may be configured to generate an output signal of a particular frequency. The output signal may be generated by the oscillator 160 and may be based on an input signal provided to the oscillator 160 at an input to the oscillator 160. The input signal may cause the oscillator 160 to generate an output signal of a particular frequency. Thus, a first input signal may cause the oscillator 160 to generate a first output signal of a first frequency and a second input signal may cause the oscillator 160 to generate a second output signal of a second frequency. As noted, the oscillator 160 may be configured to generate an output signal based on the input signal provided to the oscillator 160 at the input to the oscillator 160. In particular, the input signal may be provided from the second coupling unit 142. In some embodiments, the output signal of the oscillator 160 may be based on other inputs to the oscillator 160. For example, the other inputs may select a frequency range of operation for the oscillator 160. In some embodiments, the other inputs may be provided by the storage unit 190 or some other device.

In some embodiments, the input signal may be an oscillation control signal generated by the loop filter 150 that may be based on a phase error signal. The phase error signal may be based on a phase difference between a feedback signal and a reference signal. Alternately or additionally, the input signal may be an oscillation control signal previously determined by the loop filter 150, stored in the storage unit 190, and then provided to the oscillator 160 by the storage unit 190.

In some embodiments, the phase of an output signal generated by the oscillator 160 for the same or approximately equal inputs may vary, and may be unpredictable. These differences in phase may contribute to phase unpredictability within the PLL 110.

The divider 170 may be configured to generate the feedback signal based on the output signal. The divider 170 may generate the feedback signal by dividing the output signal by a divisor that is less than, greater than, or equal to one. The feedback signal generated by the divider 170 may be sent to the phase detector 120.

In some embodiments, the divider 170 may alter the phase of the feedback signal. The amount of the phase alteration may vary, and in some embodiments, may not be able to be predicted. As a result, a phase difference between a first feedback signal and a reference signal may vary from a phase difference between a second feedback signal and the reference signal. These differences in phase may contribute to phase unpredictability within the PLL 110.

The phase detector 120 may be configured to generate the phase error signal based on a phase difference between the feedback signal received from the divider 170 and the reference signal. The reference signal may be a signal provided from a crystal, another circuit, or system, or any other signal. The phase detector 120 may send the phase error signal to the first determination unit 180 and/or the adjustment unit 130 from an output of the phase detector 120.

The first determination unit 180 may be configured to measure the phase difference between the reference signal and the feedback signal based on the phase error signal. In particular, the first determination unit 180 may be configured to measure the phase of the feedback signal with respect to the phase error signal. For example, the phase of the feedback signal may be 30 degrees if the feedback signal is 30 degrees out of phase with the reference signal. In some embodiments, the first determination unit 180 may use a filter, such as a finite impulse response (FIR) filter to measure the phase of the feedback signal. In these and other embodiments, the FIR filter may be a short filter, such as a 16 tap running average filter. After determining the phase of the feedback signal, the first determination unit 180 may send the phase of the feedback signal to the adjustment unit 130.

The second determination unit 182 may be configured to measure the oscillation control signal being provided to the oscillator 160. In some embodiments, the second determination unit 182 may be configured to measure the oscillation control signal after a settling time of the PLL 110. In some embodiments, the second determination unit 182 may be configured to measure the oscillation control signal by determining a binary number that represents the oscillation control signal being provided to the oscillator 160. In some embodiments, the second determination unit 182 may use a filter, such as a FIR filter to measure the phase of the feedback signal. In these and other embodiments, the FIR filter may be a long filter, such as a 32 tap running average filter. The second determination unit 182 may send the determined oscillation control signal to the storage unit 190.

The storage unit 190 may be configured to store the oscillation control signal measured by the second determination unit 182, referred to herein as a previously determined oscillation control signal. In some embodiments, the storage unit 190 may store multiple previously determined oscillation control signals. Each of the multiple previously determined oscillation control signals may correspond to a separate output signal with a unique frequency that may be generated by the PLL 110. The storage unit 190 may provide a previously determined oscillation control signal for an output signal selected to be generated by the PLL 110 or being generated by the PLL 110. The storage unit 190 may provide the previously determined oscillation control signal to the adjustment unit 130, the first coupling unit 140, and/or the second coupling unit 142.

The storage unit 190 may include any type of storage medium, including a tangible or non-transitory storage medium including random access memory (RAM), read only memory (ROM), electrically erasable programmable read only memory (EEPROM), compact disk read only memory (CD-ROM) or other optical disk storage, magnetic disk storage or other magnetic storage devices, or any other storage medium which may be used to carry or store information.

The adjustment unit 130, as illustrated in FIG. 1, may be configured to adjust the phase error signal generated by the phase detector 120. The adjustment unit 130 may adjust the phase error signal by subtracting the measured phase of the feedback signal from the phase error signal. For example, if the phase error signal indicates that there is a phase difference between the feedback signal and the reference signal of 30 degrees and the measured phase of the feedback signal is 30 degrees, the adjustment unit 130 may adjust the phase error signal so that the phase error signal does not indicate a phase difference between the feedback signal and the reference signal.

The adjustment unit 130 may be further configured to adjust the phase error signal generated by the phase detector 120 to include an input signal. In some embodiments, the input signal may be a previously determined oscillation control signal provided to the adjustment unit 130 by the storage unit 190. The adjustment unit 130 may send the adjusted phase error signal to the first coupling unit 140.

The first coupling unit 140 may be configured to communicatively couple or decouple the output of the phase detector 120 with an input of the loop filter 150. Furthermore, by communicatively coupling or decoupling the output of the phase detector 120 with or from the input of the loop filter 150, the first coupling unit 140 may be configured to communicatively couple or decouple the output of the phase detector 120 with or from the input of the oscillator 160.

When the first coupling unit 140 communicatively couples the phase detector 120 with the input of the loop filter 150, the first coupling unit 140 may provide the adjusted phase error signal to the loop filter 150. When the first coupling unit 140 communicatively decouples the phase detector 120 from the input of the loop filter 150, the first coupling unit 140 may stop the adjusted phase error signal from the adjustment unit 130 from being provided to the loop filter 150. In some embodiments, when the first coupling unit 140 communicatively decouples the phase detector 120 from the input of the loop filter 150, the first coupling unit 140 may provide a previously determined oscillation control signal provided by the storage unit 190 to the loop filter 150.

The second coupling unit 142 may be configured to communicatively couple or decouple an output of the loop filter 150 with or from the input of the oscillator 160. Furthermore, by communicatively coupling or decoupling the output of the loop filter 150 with or from the input of the oscillator 160, the first coupling unit 140 may be configured to communicatively couple or decouple the output of the phase detector 120 with or from the input of the oscillator 160.

When the second coupling unit 142 communicatively couples the output of the loop filter 150 with the input of the oscillator 160, the second coupling unit 142 may provide an output of the loop filter 150, which may be an oscillation control signal, to the oscillator 160. When the second coupling unit 142 communicatively decouples the output of the loop filter 150 from the input of the oscillator 160, the second coupling unit 142 may stop the output of the loop filter 150 from being provided to the oscillator 160. In some embodiments, when the second coupling unit 142 communicatively decouples the output of the loop filter 150 from the input of the oscillator 160, the second coupling unit 142 may provide a previously determined oscillation control signal to the oscillator 160. In some embodiments, the first and second coupling units 140 and 142 may be switches or some other type of unit configured to operate as explained herein.

The loop filter 150 may be configured to generate an oscillation control signal that may be provided to the oscillator 160. In some embodiments, the loop filter 150 may generate the oscillation control signal by filtering a signal provided to the loop filter 150. In some embodiments, such as when the first coupling unit 140 is communicatively decoupling the output of the phase detector 120 and the input of the oscillator 160, the signal provided to the loop filter 150 may be a previously determined oscillation control signal provided by the storage unit 190. In some embodiments, such as when the first coupling unit 140 is communicatively coupling the output of the phase detector 120 and the input of the oscillator 160, the signal provided to the loop filter 150 may be the adjusted phase error signal. Thus, the loop filter 150 may generate the oscillation control signal based on the phase error signal because the adjusted phase error signal is based on the phase error signal.

In some embodiments, the loop filter 150 may be a digital loop filter. In these and other embodiments, the loop filter 150 may temporarily store information regarding the signal (e.g. the adjusted phase error signal or previously determined oscillation control signal) that the loop filter 150 is filtering. In some embodiments, the loop filter 150 may also have an integrator that may also temporarily store information regarding the signal that the loop filter 150 is filtering. In some embodiments, the loop filter 150 may be an infinite impulse response (IIR) filter. In these and other embodiments, the loop filter 150 may be implemented as a cascaded IIR filter. Here the previously determined oscillation control signal provided to the loop filter 150 may be provided to every stage of the cascaded IIR filter. In particular, the previously determined oscillation control signal may be provided to the output of every stage of the cascaded IIR filter before it is fed back internally within every stage.

It is now explained how the components of the system 100 operate together to reduce the settling time of the PLL 110. In some embodiments, the system 100 may be operated to generate a discrete number of different output signals, each at a different frequency. The system 100 may switch between generating different output signals. When switching between generating a first output signal and generating a second output signal, the system 100 may reduce or eliminate the settling time for the PLL 110 to lock to the frequency and phase of the second output signal. The settling time for the PLL 110 may be the time during which frequency differences and phase differences between the output signal and the reference signal are corrected by the PLL 110 so that the output signal and the reference signal are locked.

In some embodiments, for some of the different output signals that the system 100 may generate, the system 100 may store a previously determined oscillation control signal for each of the different output signals that may be provided to the oscillator 160 to cause the oscillator 160 to generate the different output signals. For example, a first previously determined oscillation control signal may be provided to the oscillator 160 to cause the oscillator 160 to generate a first output signal at a first frequency. A second previously determined oscillation control signal may be provided to the oscillator 160 to cause the oscillator 160 to generate a second output signal at a second frequency. The previously determined oscillation control signals may be digital numbers and may be stored in the storage unit 190.

To generate the previously determined oscillation control signals, the system 100 may cause the PLL 110 to generate the output signals and capture the oscillation control signals used to cause the oscillator 160 to generate the output signals. For example, the PLL 110 may be configured to generate a first output signal. A first oscillation control signal being provided to the oscillator 160 to cause the oscillator 160, and thus the PLL 110, to generate the first output signal may be measured and then stored when the PLL 110 is in steady state, e.g. after the settling time of the PLL 110.

To generate the different output signals when using a similar reference signal, the divider 170 of the PLL 110 may be adjusted. For example, when the reference signal is 100 megahertz (MHz) and the divisor in the divider 170 is one, the output signal may be 100 MHz. When the divisor is 2, the output signal may be 200 MHz. When the divisor is 2.5, the output signal may be 250 MHz.

When changing to generate a second output signal rather than the first output signal, the system 100 may change the divisor in the divider 170. By changing the divider 170, the PLL 110 may compensate for the difference between the feedback signal and the reference signal and change the output signal accordingly. However, the compensation by the PLL 110 may take time. Furthermore, depending on the amount of difference between frequencies of the first and second output signals and the loop bandwidth of the PLL 110, the system 100 may take some time to settle to a new oscillation control signal 160 before reaching the frequency of the second output signal.

To reduce a settling time of the PLL 110 when changing to an output signal, the system 100 may change the divisor in the divider 170 that corresponds to the output signal and at approximately the same time, or at a previous time, provide a previously determined oscillation control signal to the oscillator 160 that corresponds to the output signal. Due to phase unpredictability within the PLL 110 resulting from the divider 170, the oscillator 160, and/or other components within the PLL 110, the phase of the feedback signal or some other signal within the PLL 110 may be different from the phase of the feedback signal or the some other signal when the previously determined oscillation control signal is measured. For example, the phase of a feedback signal may be 30 degrees when the previously determined oscillation control signal is measured. When the previously determined oscillation control signal is applied to the oscillator 160 to generate the output signal, the phase of the feedback signal may be 45 degrees due to phase unpredictability in the divider 170. The PLL 110, however, may expect the phase of the feedback signal to be 30 degrees based on the previously determined oscillation control signal and thus a phase difference between the feedback signal and the reference signal of 15 degrees may exist. Known systems may have the PLL 110 compensate for the phase difference to settle out the phase difference during a settling time of the PLL 110. The system 100 reduces or eliminates the settling time for the PLL 110 to compensate for the phase difference by measuring the phase difference and subtracting the measured phase difference from an intermediate signal so that the PLL 110 does not compensate for the phase difference to settle out the phase difference during a settling time.

The phase difference between an expected phase for a previously determined oscillation control signal and an actual phase may be determined by measuring a phase of the feedback signal when the oscillator 160 is provided the previously determined oscillation control signal and the PLL 110 is in an open loop configuration. In particular, the phase of the feedback signal may be determined when an output of the phase detector 120 and an input of the oscillator 160 are communicatively decoupled. The first coupling unit 140 and/or the second coupling unit 142 may communicatively decouple the output of the phase detector 120 and the input of the oscillator 160. When the output of the phase detector 120 and the input of the oscillator 160 are communicatively decoupled, a phase error signal generated by the phase detector 120 that indicates a phase error and which is based on a phase difference between the feedback signal and the reference signal does not result in a change in the output signal being generated by the oscillator 160. In contrast, when the PLL 110 is in a closed loop configuration, e.g., when the output of the phase detector 120 and the input of the oscillator 160 are communicatively coupled, the phase error signal may result in a change in the output signal when the phase error signal indicates a phase error.

In some embodiments, the first coupling unit 140 may communicatively decouple the output of the phase detector 120 and the input of the oscillator 160 while the second coupling unit 142 communicatively couples the output of the loop filter 150 and the input of the oscillator 160. In these and other embodiments, the first coupling unit 140 may provide the previously determined oscillation control signal to the loop filter 150. The loop filter 150 may filter the previously determined oscillation control signal and provide a filtered version of the previously determined oscillation control signal to the oscillator 160 to allow the oscillator to generate the output signal.

In some embodiments, the second coupling unit 142 may communicatively decouple the output of the phase detector 120 and the input of the oscillator 160 while the first coupling unit 140 communicatively couples the input of the loop filter 150 with the output of the phase detector 120. In these and other embodiments, the second coupling unit 142 may provide the previously determined oscillation control signal to the oscillator 160.

In some embodiments, both the first and second coupling unit 140 and 142 may communicatively decouple the output of the phase detector 120 and the input of the oscillator 160. In these and other embodiments, the first coupling unit 140 may provide the previously determined oscillation control signal to the loop filter 150 and the second coupling unit 142 may provide the previously determined oscillation control signal to the oscillator 160. By providing the previously determined oscillation control signal to the loop filter 150 and to the oscillator 160 separately, the loop filter 150 may be stabilized at the previously determined oscillation control signal and the previously determined oscillation control signal may be provided to the oscillator 160 without the loop filter 150 changing the previously determined oscillation control signal based on a previously stored value, e.g., a voltage or digital value.

When the output of the phase detector 120 and the input of the oscillator 160 are communicatively decoupled, the phase of the feedback signal with respect to the reference signal may be measured based on the phase error signal generated by the phase detector 120. The first determination unit 180 may measure the phase of the feedback signal based on the phase error signal. In some embodiments, the output of the phase detector 120 and the input of the oscillator 160 may be communicatively decoupled for a short amount of time. For example, the output of the phase detector 120 and the input of the oscillator 160 may be communicatively decoupled for less than 0.5 microseconds (μsec), 1 μsec, 2 μsec, 5 μsec, or 10 μsec, which may depend on the time needed to measure the phase of the phase error signal.

After the phase of the feedback signal with respect to the reference signal is measured, the measured phase may be used by the adjustment unit 130 to subtract the measured phase from the phase error signal. In some embodiments, the measured phase is arithmetically cancelled from the phase error signal. For example, when the phase error signal indicates a phase difference of 30 degrees, the adjustment unit 130 using the measured phase may subtract the 30 degrees from the phase error signal. As a result, the phase error signal may indicate that there is no phase difference between the feedback signal and the reference signal. The adjustment unit 130 may also add the previously determined oscillation control signal to the phase error signal. The adjusted phase error signal may be output by the adjustment unit 130 and sent to the first coupling unit 140.

After the phase difference is measured and while the phase difference is being subtracted from the phase error signal and the previously determined oscillation control signal is being added to the phase error signal, the PLL 110 may begin operating as a closed loop. The PLL 110 may operate as a closed loop by communicatively coupling the output of the phase detector 120 and an input of the oscillator 160 using the first and second coupling units 140 and 142. With the first and second coupling unit 140 and 142 communicatively coupling the output of the phase detector 120 and the input of the oscillator 160, the adjusted phase error signal may be passed by the first coupling unit 140 from the adjustment unit 130 to the loop filter 150.

When the PLL 110 is in a closed loop configuration, the adjusted phase error signal may be substantially equivalent to the previously determined oscillation control signal because any phase difference due to phase unpredictability in the PLL 110 may be subtracted by the adjustment unit 130. As a result, the loop filter 150 may output an oscillation control signal based on the adjusted phase error signal that is substantially equivalent to the previously determined oscillation control signal. The second coupling unit 142 may pass the oscillation control signal to the oscillator 160. The oscillator 160 may continue to generate the output signal. As a result, the output signal generated by the oscillator 160 may be stable from the time that the previously determined oscillation control signal is presented to the oscillator 160 while the PLL 110 is operating as an open loop until the PLL 110 is operating as a closed loop and thereafter until the reference frequency and/or some other factor causes changes in the output signal of the PLL 110. As a result, there may be little or no time during which frequency differences and phase differences are occurring after the PLL 110 begins generating a different output signal. Thus, the PLL 110 has little or no settling time when switching between generating different output signals.

As noted, changes to the reference frequency and/or some other factor, such as supply voltage variations, temperature differentials, among other external factors may cause the phase and/or frequency of the output signal to vary. A change in the phase and/or frequency of the output signal may change the phase and/or frequency of the feedback signal. The phase detector 120 may detect the phase difference between the feedback signal and the reference signal and generate a corresponding phase error signal. The adjustment unit 130 may adjust the phase error signal. However, the adjusted phase error signal may now include a phase component that is not zero because the measured phase compensates for the phase unpredictability in the PLL 110 when the output signal is changed but not for changes to the PLL 110 after the PLL 110 is in a closed loop configuration. As a result, the loop filter 150 may determine a new oscillation control signal based on the adjusted phase error signal that may cause the oscillator 160 to adjust the phase and/or frequency of the output signal so that the adjusted phase error signal indicates that there is not a phase difference between the feedback signal and the reference signal. Note that the phase error signal still indicates that there is a phase difference between the feedback signal and the reference signal due to the phase unpredictability in the PLL 110. However, the phase difference due to the phase unpredictability in the PLL 110 is subtracted out of the phase error signal by the adjustment unit 130 using the measured phase of the feedback signal when the PLL 110 is in the open loop configuration so that the adjusted phase error signal does not indicate that there is a phase difference or phase error. In this manner, the PLL 110 may operate to compensate for the phase unpredictability of the PLL 110.

In some embodiments, the second determination unit 182 may determine a value for the new oscillation control signal and store the value in the storage unit 190. The value for the new oscillation control signal may be used as the previously determined oscillation control signal when the PLL 110 returns to generating the output signal after generating a different output signal.

For example, when switching to generating an output signal, assume that the determined phase for the feedback signal during the open loop stage is 30 degrees. Thus, the adjustment unit 130 may subtract the 30 degree phase from the phase error signal to reduce or eliminate the settling time of the PLL 110. Further, assume while generating the output signal when the PLL 110 is in a closed loop configuration, a supply voltage provided to the oscillator 160 varies causing the phase of the output signal to change by 15 degrees. The phase of the feedback signal is now 45 degrees from the phase of the reference signal. As a result, the phase error signal indicates a phase difference of 45 degrees. The adjustment unit 130 may subtract 30 degrees of phase difference based on the measured phase of the feedback signal while the PLL 110 is in an open loop configuration, resulting in the adjusted phase error signal indicating that there is 15 degrees of phase difference. The loop filter 150 may generate a new oscillation control signal based on the 15 degrees of phase difference to cause the oscillator 160 to correct the phase of the output signal. In some embodiments, the second determination unit 182 may capture the new oscillation control signal output by the loop filter 150.

The system 100 thus provides an agile PLL 110 that is able to switch between generating different output signals with reduced or no settling time when switching to an output signal. The system 100 may be used in applications that may switch between different output signals and have little or no time for the output signals to settle to the correct frequency and phase. For example, the system 100 may be used in devices operating in a wireless network, such as a long-term evolution (LTE) cellular network.

Modifications, additions, or omissions may be made to the system 100 without departing from the scope of the present disclosure. Alternately or additionally, the PLL 110 may not include the second coupling unit 142 or the first coupling unit 140. As another example, the PLL 110 may include various digital to analog converters (DAC) or analog to digital converters (ADC). For example, the oscillator 160 may be a voltage-controlled oscillator (VCO), the loop filter 150 may be a digital loop filter, and a DAC may be between the output of the loop filter 150 and the input of the oscillator 160. In these and other embodiments, the loop filter 150 may output a digital value that may be converted to an analog value by the DAC. Alternately or additionally, the oscillator 160 may be a digitally controlled oscillator (DCO). In some embodiments, the PLL 110 may be a type I PLL. Alternately, the PLL 110 may be a type II or other higher types of PLL.

As another example, the phase detector 120 and the adjustment unit 130 may be formed by analog components and the adjustment unit 130 may output an analog adjusted phase error signal. An ADC may convert the analog adjusted phase error signal to a digital adjusted phase error signal and send the digital adjusted phase error signal to the loop filter 150. Alternately or additionally, the adjustment unit 130 and/or the phase detector 120 may be digital components. Thus, in some embodiments, the PLL 110 may be a digital PLL or an all-digital PLL.

As another example, a portion of the adjustment unit 130 that subtracts the phase of the feedback signal measured by the first determination unit 180 from the phase error signal may be referred to herein as the phase adjustment portion. In some embodiments, the phase adjustment portion may be in a different location in the PLL 110. For example, the phase adjustment portion may be between the divider 170 and the phase detector 120. In these and other embodiments, the phase adjustment portion may adjust the feedback signal to subtract a phase difference between the reference signal and the feedback signal. As a result, the phase detector 120 may not indicate a difference between the phase of the reference signal and the feedback signal.

In short, the adjustment unit 130 may be positioned within the PLL 110 so that the phase determined by the first determination unit 180 that results from phase unpredictability within the PLL 110 may be compensated for by subtracting the measured phase from the phase error signal before the oscillator 160 adjusts the output signal based on the measured phase. Thus, in general, the adjustment unit 130, and in particular the phase adjustment portion of the adjustment unit 130 may be configured to subtract the measured phase from an intermediate signal of the PLL 110. An intermediate signal of the PLL 110 may be a signal upon which the output signal of the PLL 110 is based, for example, the feedback signal, the phase error signal, the adjusted phase error signal, and the oscillation control signal. Thus, the description above with respect to FIG. 1 discloses one embodiment of an intermediate signal, e.g., the phase error signal, from which the measured phase is subtracted.

Figure 2A:
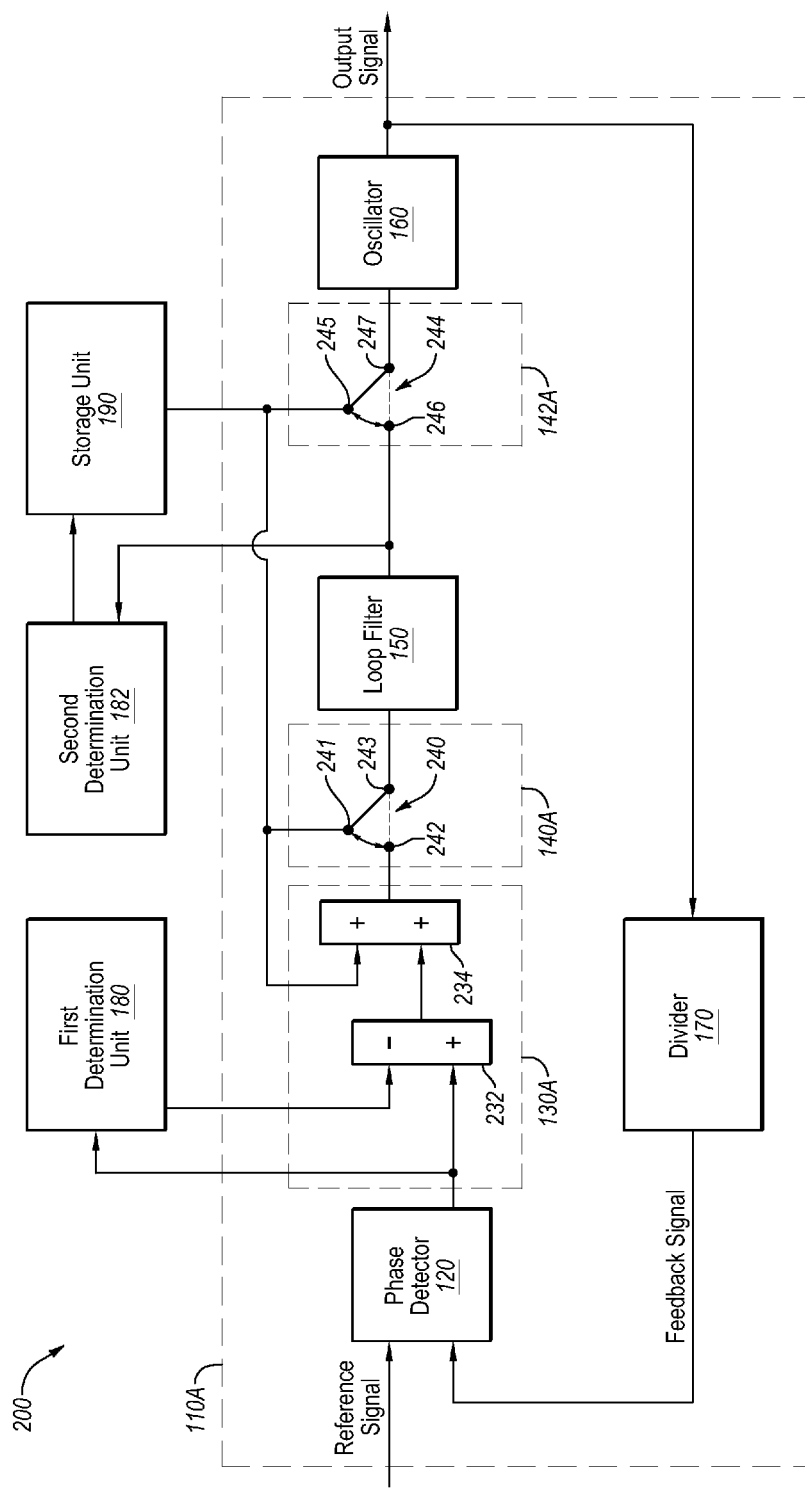
FIG. 2A is a block diagram of an example system that includes a phase-locked loop in an open loop configuration.

FIG. 2A is a block diagram of an example system 200 that includes a phase-locked loop 110A in an open loop configuration, arranged in accordance with at least some embodiments described herein. The system 200 may illustrate an example implementation of the system 100 of FIG. 1. In particular, the system 200 may illustrate an example implementation of the system 100 of FIG. 1 where the PLL 110A is a type 1 PLL.

In this example implementation of the system 100 of FIG. 1, the PLL 110A is analogous to the PLL 110 of FIG. 1 and includes the phase detector 120, the loop filter 150, the oscillator 160, the divider 170, the first determination unit 180, the second determination unit 182 and the storage unit 190 that are described with respect to FIG. 1. Thus, no further description is provided herein with respect to FIG. 2A for the phase detector 120, the loop filter 150, the oscillator 160, the divider 170, the first determination unit 180, the second determination unit 182 and the storage unit 190.

The PLL 110A further includes an adjustment unit 130A, a first coupling unit 140A, and a second coupling unit 142A. The adjustment unit 130A, the first coupling unit 140A, and the second coupling unit 142A may be analogous in operation to the adjustment unit 130, the first coupling unit 140, and the second coupling unit 142, respectively of FIG. 1. The adjustment unit 130A, the first coupling unit 140A, and the second coupling unit 142A illustrated in FIG. 2A provide an example implementation of the adjustment unit 130, the first coupling unit 140, and the second coupling unit 142, respectively of FIG. 1.

The adjustment unit 130A includes a first adder 232 and a second adder 234. The first adder 232 may include two inputs. A first input may be configured to receive the phase error signal provided by the phase detector 120. The second input may be configured to receive the phase of the feedback signal measured by the first determination unit 180. The first adder 232 may be configured to subtract the phase of the feedback signal determined by the first determination unit 180 from the phase error signal provided by the phase detector 120 and output a phase-adjusted phase error signal.

The second adder 234 may include two inputs. A first input may be configured to receive the phase-adjusted phase error signal provided by the first adder 232. The second input may receive an input signal, such as a previously determined oscillation control signal from the storage unit 190. The second adder 234 may be configured to combine the phase-adjusted phase error signal with the received input signal and output the adjusted phase error signal to the first coupling unit 140A.

The first coupling unit 140A may include a first switch 240 that includes a first node 241, a second node 242, and a third node 243. The first switch 240 may operate to communicatively couple or decouple the output of the adjustment unit 130A (e.g., an output of the second adder 234) with or from the input of the loop filter 150 by communicatively coupling or decoupling the second and third nodes 242 and 243. The first switch 240 may also operate to communicatively couple or decouple the output of the storage unit 190, which may provide a previously determined oscillation control signal, with or from the input of the loop filter 150 by communicatively coupling or decoupling the first and third nodes 241 and 243.

When the input of the loop filter 150 is communicatively coupled to the output of the storage unit 190 to allow the loop filter 150 to receive the previously determined oscillation control signal, the input of the loop filter 150 is communicatively decoupled from the output of the adjustment unit 130A. Furthermore, when the input of the loop filter 150 is communicatively coupled to the output of the storage unit 190 to allow the loop filter 150 to receive the previously determined oscillation control signal, the first switch 240 is communicatively decoupling the output of the phase detector 120 and the input of the oscillator 160.

The second coupling unit 142A may include a second switch 244 that includes a first node 245, a second node 246, and a third node 247. The second switch 244 may operate to communicatively couple or decouple the output of the loop filter 150 with or from the input of the oscillator 160 by communicatively coupling or decoupling the second and third nodes 246 and 247. The second switch 244 may also operate to communicatively couple or decouple the output of the storage unit 190, which may provide a previously determined oscillation control signal, with or from the input of the oscillator 160 by communicatively coupling or decoupling the first and third nodes 245 and 247.

When the input of the oscillator 160 is communicatively coupled to the output of the storage unit 190 to allow the oscillator 160 to receive the previously determined oscillation control signal, the input of the oscillator 160 is communicatively decoupled from the output of the loop filter 150. Furthermore, when the input of the oscillator 160 is communicatively coupled to the output of the storage unit 190 to allow the oscillator 160 to receive the previously determined oscillation control signal from the storage unit 190, the second switch 244 is communicatively decoupling the output of the phase detector 120 and the input of the oscillator 160.

FIG. 2A illustrates the PLL 110A in an open loop configuration, with the first and second switches 240 and 244 communicatively decoupling the output of the phase detector 120 from the input of the oscillator 160 by coupling the first nodes 241 and 245 to the third nodes 243 and 247, respectively.

In the open loop configuration of FIG. 2A, the PLL 110A may measure the phase of the feedback signal using the phase detector 120 and the first determination unit 180 while the first and second switches 240 and 244 provide the loop filter 150 and the oscillator 160 with a previously determined oscillation control signal from the storage unit 190. After measuring the phase of the feedback signal, the first determination unit 180 may provide the measured phase to the first adder 232. The storage unit 190 may also provide the second adder 234 with the previously determined oscillation control signal.

Furthermore, in the open loop configuration of FIG. 2A, the adjusted phase error signal may be at the second node 242 of the first switch 240. With the PLL 110A in the open loop configuration, the adjusted phase error signal may be approximately equal or equal to the previously determined oscillation control signal. Furthermore, the oscillation control signal determined by the loop filter 150, which is approximately equal or equal to the previously determined oscillation control signal, may be at the second node 246 of the second switch 244. Note that the third nodes 243 and 247 also have the previously determined oscillation control signal. Thus, after measuring the phase of the feedback signal and adjusting the phase error signal at the adjustment unit 130A, the second nodes 242 and 246 and the third nodes 243 and 247 all have the approximately the same or the same signal, namely the oscillation control signal.

Figure 2B:
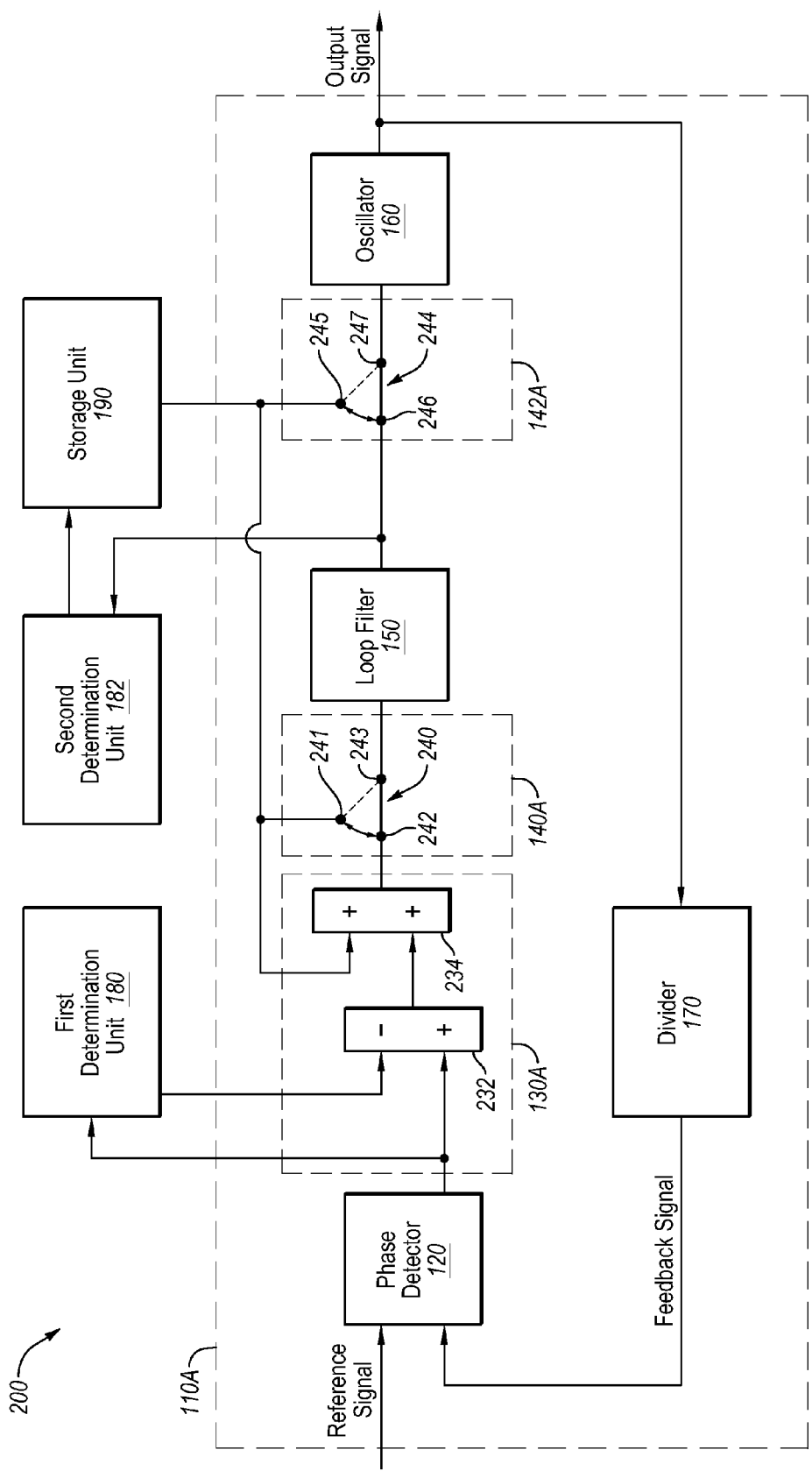
FIG. 2B is a block diagram of the example system of FIG. 2A with the phase-locked loop in a closed loop configuration.

After determining the phase of the feedback signal and adjusting the phase error signal, the first and second switches 240 and 244 may be adjusted so that the PLL 110A is in a closed loop configuration so that the output of the phase detector 120 and the input of the oscillator 160 are communicatively coupled. FIG. 2B illustrates the system of FIG. 2A with the PLL 110A in a closed loop configuration. In the closed loop configuration, the first switch 240 communicatively couples the second node 242 and the third node 243 and the second switch 244 communicatively couples the second node 246 and the third node 247. As noted, the second nodes 242 and 246 and the third nodes 243 and 247 all have approximately the same or the same signal, namely the oscillation control signal. Thus, when the first switch 240 communicatively couples the second node 242 and the third node 243 and the second switch 244 communicatively couples the second node 246 and the third node 247, the PLL 110A may transition from the open loop configuration to the closed loop configuration without affecting the output signal.

Modifications, additions, or omissions may be made to the system 200 without departing from the scope of the present disclosure. For example, the system 100 may include a gain block between the first adder 232 and the second adder 234.

Figure 3:
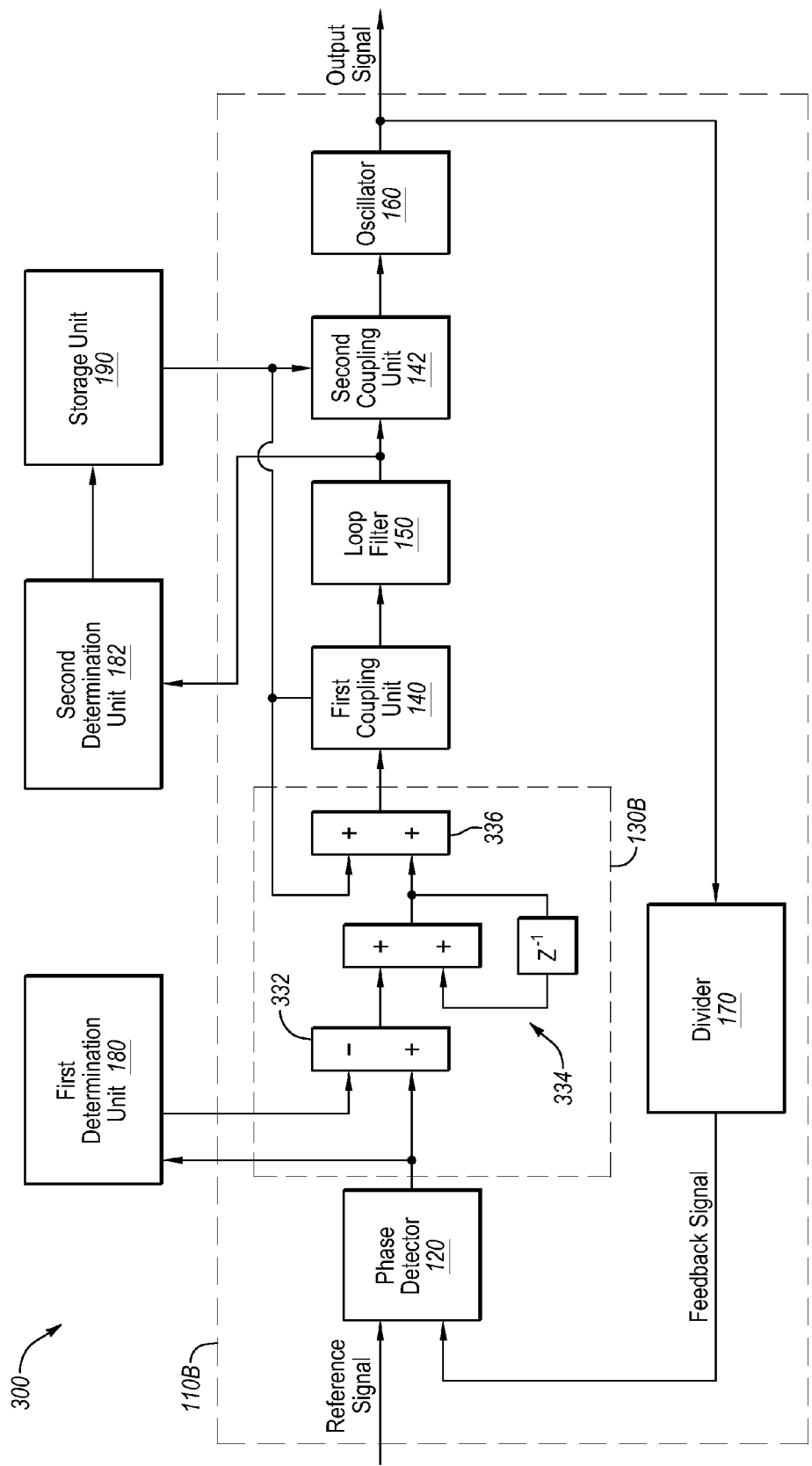
FIG. 3 is a block diagram of another example system for reducing settling time in a phase-locked loop.

FIG. 3 is a block diagram of another example system 300 for reducing settling time in a phase-locked loop 110B, arranged in accordance with at least some embodiments described herein. The system 300 illustrates an example implementation of the system 100 of FIG. 1. In particular, the system 300 illustrates an example implementation of the system 100 of FIG. 1 where the PLL 110B is a type II PLL that includes an accumulator 334.

In this example implementation of the system 100 of FIG. 1, the PLL 110B is analogous to the PLL 110 of FIG. 1 and includes the phase detector 120, the first and second coupling units 140 and 142, the loop filter 150, the oscillator 160, the divider 170, the first determination unit 180, and the second determination unit 182 that are described with respect to FIG. 1. Thus, no further description is provided herein with respect to FIG. 3 for the phase detector 120, the first and second coupling units 140 and 142, the loop filter 150, the oscillator 160, the divider 170, the first determination unit 180, and the second determination unit 182. In some embodiments, the first and second coupling units 140 and 142 of FIG. 3 may be implemented as the first and second coupling units 140A and 142A of FIGS. 2A and 2B.

The PLL 110A further includes an adjustment unit 130B. The adjustment unit 130B may be analogous in operation in some respects to the adjustment unit 130 of FIG. 1. The adjustment unit 130B provides an example implementation of the adjustment unit 130 of FIG. 1 for a Type II PLL.

The adjustment unit 130B includes a first adder 332, an accumulator 334, and a second adder 336. The first adder 332 may include two inputs. A first input may receive the phase error signal provided by the phase detector 120. The second input may receive the phase of the feedback signal measured by the first determination unit 180. The first adder 332 may be configured to subtract the phase of the feedback signal measured by the first determination unit 180 from the phase error signal provided by the phase detector 120 and output a phase adjusted phase error signal.

The accumulator 334 may include two inputs. A first input may receive the phase adjusted phase error signal provided by the first adder 332. The second input may receive an integrator output from the accumulator 334. The accumulator 334 may be configured to combine the phase adjusted phase error signal with the integrator output and output the phase and integrator phase error signal to the second adder 336.

The second adder 336 may include two inputs. A first input may receive the phase and integrator adjusted phase error signal provided by the accumulator 334. The second input may receive an input signal, such as a previously determined oscillation control signal from the storage unit 190. The second adder 336 may be configured to combine the phase and integrated adjusted phase error signal with the received input signal and output the adjusted phase error signal to the first coupling unit 140.

In general, the accumulator 334 may be configured to integrate the phase error signal generated by the phase detector 120 over a period to reduce variability in the phase error signal. When the system 300 is switching to generating a different output signal and the PLL 100B is in an open loop configuration, the accumulator 334 may be reset to indicate that phase adjusted phase error signal did not previously indicate a phase difference between the reference signal and the feedback signal. Modifications, additions, or omissions may be made to the system 300 without departing from the scope of the present disclosure.

Figure 4:
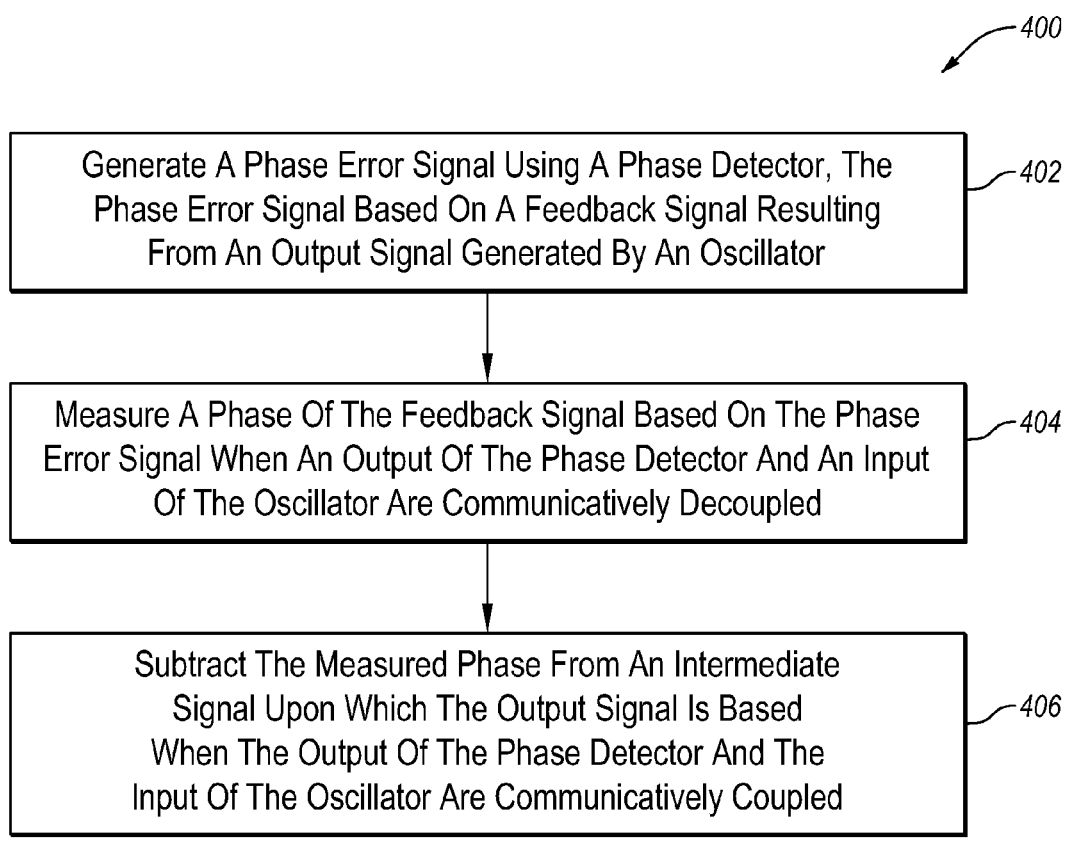
FIG. 4 is a flow chart of an example method of reducing settling time in a phase-locked loop.

FIG. 4 is a flow chart of an example method 400 of reducing settling time in a phase-locked loop, arranged in accordance with at least some embodiments described herein. The method 400 may be implemented, in some embodiments, by a system, such as the system 100 of FIG. 1, the system 200 of FIGS. 2A and 2B, and/or the system 300 of FIG. 3. Although illustrated as discrete blocks, various blocks may be divided into additional blocks, combined into fewer blocks, or eliminated, depending on the desired implementation.

The method 400 may begin at block 402, where a phase error signal may be generated using a phase detector. The phase error signal may be based on a feedback signal resulting from an output signal generated by an oscillator. In some embodiments, the feedback signal may be a division of the output signal.

In block 404, a phase of the feedback signal based on the phase error signal may be measured when an output of the phase detector and an input of the oscillator are communicatively decoupled. In some embodiments, the output signal may be based on an input signal, such as a previously determined oscillation control signal, when the output of the phase detector and the input of the oscillator are communicatively decoupled.

In block 406, the measured phase may be subtracted from an intermediate signal upon which the output signal is based when the output of the phase detector and the input of the oscillator are communicatively coupled. In some embodiments, the intermediate signal may be the phase error signal.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, when the intermediate signal is the phase error signal, the method 400 may further include generating an adjusted phase error signal based on an input signal and the phase error signal with the measured phase subtracted therefrom. In these and other embodiments, when the output of the phase detector and the input of the oscillator are communicatively coupled, the output signal may be based on the adjusted phase error signal. In some embodiments, the input signal may be a previously determined oscillation control signal configured to cause the oscillator to generate the output signal.

Figure 5:
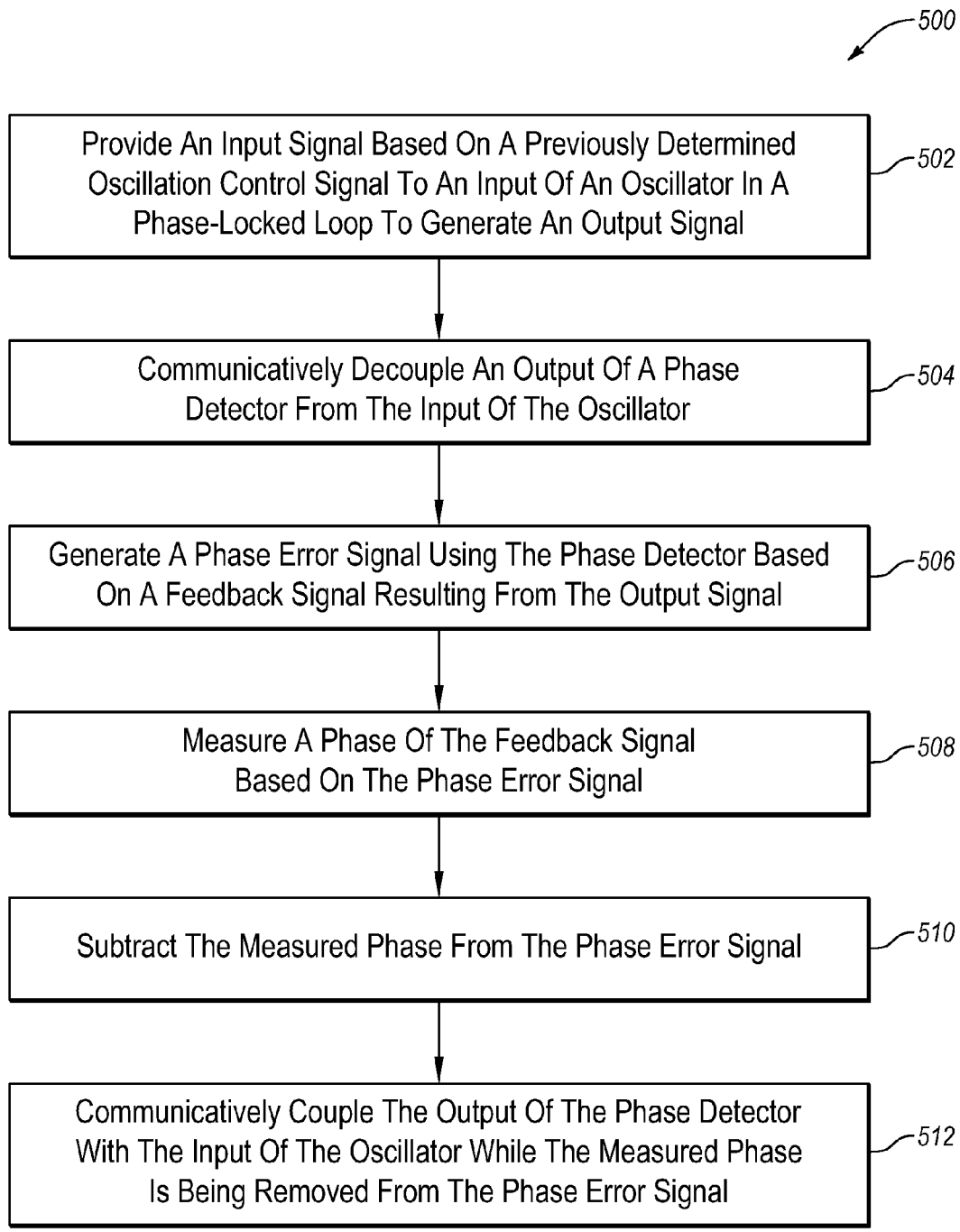
FIG. 5 is a flow chart of another example method of reducing settling time in a phase-locked loop.

FIG. 5 is a flow chart of an example method 500 of reducing settling time in a phase-locked loop, arranged in accordance with at least some embodiments described herein. The method 500 may be implemented, in some embodiments, by a system, such as the system 100 of FIG. 1, the system 200 of FIGS. 2A and 2B, and/or the system 300 of FIG. 3. Although illustrated as discrete blocks, various blocks may be divided into additional blocks, combined into fewer blocks, or eliminated, depending on the desired implementation.

The method 500 may begin at block 502, where an input signal based on a previously determined oscillation control signal may be provided to an input of an oscillator in a PLL to generate an output signal. In block 504, an output of a phase detector may be communicatively decoupled from the input of the oscillator.

In block 506, a phase error signal may be generated using the phase detector. The phase error signal may be based on a feedback signal resulting from the output signal. In some embodiments, the feedback signal may be a division of the output signal.

In block 508, a phase of the feedback signal based on the phase error signal may be measured. In block 510, the measured phase may be subtracted from the phase error signal.

In block 512, the output of the phase detector may be communicatively coupled with the input of the oscillator while the measured phase is being subtracted from the phase error signal.

In some embodiments, the method 500 may further include providing the input signal to an input of a loop filter communicatively coupled between the output of the phase detector and the input of the oscillator when the output of the phase detector is communicatively decoupled from the input of the oscillator. The method 500 may further include measuring a new oscillation control signal based on a combination of the previously determined oscillation control signal and the phase error signal with the measured phase subtracted therefrom.

Although the subject matter herein has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A circuit comprising:
   a phase detector configured to generate a phase error signal based on a feedback signal;
   an oscillator configured to generate an output signal, the feedback signal based on the output signal;
   a determination unit configured to measure a phase of the feedback signal based on the phase error signal when an output of the phase detector and an input of the oscillator are communicatively decoupled; and
   an adjustment unit configured to subtract the measured phase of the feedback signal from an intermediate signal upon which the output signal is based when the output of the phase detector and the input of the oscillator are communicatively coupled.

2. The circuit of claim 1, wherein the intermediate signal is the phase error signal.

3. The circuit of claim 2, wherein the adjustment unit is further configured to output an adjusted phase error signal based on an input signal and the phase error signal after the measured phase of the feedback signal is subtracted therefrom, wherein when the output of the phase detector and the input of the oscillator are communicatively coupled the output signal is based on the adjusted phase error signal.

4. The circuit of claim 3, wherein when the output of the phase detector and the input of the oscillator are communicatively decoupled, the output signal is based on the input signal.

5. The circuit of claim 3, wherein the input signal is a previously determined oscillation control signal configured to cause the oscillator to generate the output signal.

6. The circuit of claim 1, further comprising a loop filter communicatively coupled between the output of the phase detector and the input of the oscillator.

7. The circuit of claim 1, wherein when the output of the phase detector and the input of the oscillator are communicatively decoupled, an output signal value is provided to the loop filter and to the input of the oscillator.

8. The circuit of claim 1, further comprising a divider configured to generate the feedback signal based on the output signal.

9. The circuit of claim 1, further comprising a coupling unit communicatively coupled between the output of the phase detector and the input of the oscillator and configured to communicatively couple and decouple the output of the phase detector from the input of the oscillator.

10. A method of reducing settling time in a phase-locked loop, the method comprising:
    generating a phase error signal using a phase detector, the phase error signal based on a feedback signal resulting from an output signal generated by an oscillator;
    measuring a phase of the feedback signal based on the phase error signal when an output of the phase detector and an input of the oscillator are communicatively decoupled; and
    subtracting the measured phase from an intermediate signal upon which the output signal is based when the output of the phase detector and the input of the oscillator are communicatively coupled.

11. The method of claim 10, wherein the intermediate signal is the phase error signal.

12. The method of claim 11, further comprising generating an adjusted phase error signal based on an input signal and the phase error signal with the measured phase subtracted therefrom, wherein when the output of the phase detector and the input of the oscillator are communicatively coupled, the output signal is based on the adjusted phase error signal.

13. The method of claim 12, when the output of the phase detector and the input of the oscillator are communicatively decoupled, the output signal is based on the input signal.

14. The method of claim 12, wherein the input signal is a previously determined oscillation control signal configured to cause the oscillator to generate the output signal.

15. The method of claim 12, further comprising generating a new input signal based on the adjusted phase error signal.

16. The method of claim 10, wherein the feedback signal is a division of the output signal.

17. A method of reducing settling time in a phase-locked loop, the method comprising:
  providing an input signal based on a previously determined oscillation control signal to an input of an oscillator in a phase-locked loop to generate an output signal;
  communicatively decoupling an output of a phase detector from the input of the oscillator;
  generating a phase error signal using the phase detector based on a feedback signal resulting from the output signal;
  measuring a phase of the feedback signal based on the phase error signal;
  subtracting the measured phase from the phase error signal; and
  communicatively coupling the output of the phase detector to the input of the oscillator while the measured phase is being subtracted from the phase error signal.

18. The method of claim 17, further comprising providing the input signal to an input of a loop filter communicatively coupled between the output of the phase detector and the input of the oscillator when the output of the phase detector is communicatively decoupled from the input of the oscillator.

19. The method of claim 17, further comprising generating a new oscillation control signal based on a combination of the previously determined oscillation control signal and the phase error signal with the measured phase subtracted therefrom.

20. The method of claim 17, wherein the feedback signal is a division of the output signal.

\* \* \* \* \*